United States Patent
Nishigaki et al.

(10) Patent No.: US 8,102,098 B2
(45) Date of Patent: Jan. 24, 2012

(54) PIEZOELECTRIC-DRIVEN MEMS ELEMENT

(75) Inventors: Michihiko Nishigaki, Kanagawa-ken (JP); Toshihiko Nagano, Kanagawa-ken (JP); Hiroshi Ono, Kanagawa-ken (JP); Takashi Kawakubo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 12/578,664

(22) Filed: Oct. 14, 2009

(65) Prior Publication Data

US 2010/0244628 A1 Sep. 30, 2010

(30) Foreign Application Priority Data

Mar. 30, 2009 (JP) ................................. 2009-082270

(51) Int. Cl.
*H01L 41/08* (2006.01)
(52) U.S. Cl. ........................................ 310/332; 310/330
(58) Field of Classification Search ............ 310/330–332
See application file for complete search history.

(56) References Cited

U.S. PATENT DOCUMENTS

| | | | | |
|---|---|---|---|---|
| 3,821,747 A | * | 6/1974 | Mason ............................. | 346/62 |
| 4,670,682 A | * | 6/1987 | Harnden et al. ............... | 310/332 |
| 4,893,048 A | * | 1/1990 | Farrall ........................... | 310/331 |
| 5,068,567 A | * | 11/1991 | Jones ............................ | 310/332 |
| 5,101,278 A | * | 3/1992 | Itsumi et al. .................. | 348/357 |
| 5,103,361 A | * | 4/1992 | Nagatsuka et al. ............ | 360/292 |
| 5,276,672 A | * | 1/1994 | Miyazaki et al. ............. | 369/126 |
| 2006/0055287 A1 | | 3/2006 | Kawakubo et al. | |
| 2008/0042521 A1 | | 2/2008 | Kawakubo et al. | |

FOREIGN PATENT DOCUMENTS

| | | |
|---|---|---|
| JP | 2007-259669 | 10/2007 |
| JP | 2008-005642 | 1/2008 |

* cited by examiner

*Primary Examiner* — Mark Budd
(74) *Attorney, Agent, or Firm* — Turocy & Watson, LLP

(57) ABSTRACT

A piezoelectric-driven MEMS element includes a substrate, a beam, a fixed portion, a fixed electrode portion and a power source. The beam is provided with a lower electrode film, a lower piezoelectric film, a middle electrode film, an upper piezoelectric film and an upper electrode film. The fixed portion fixes one end of the beam onto the substrate so as to hold the beam with a gap above the substrate. The fixed electrode portion has a capacitive gap between the fixed electrode portion and the other end of the beam. In addition, at least one or two of the lower electrode film, the middle electrode film and the upper electrode film is thicker than the rest thereof.

6 Claims, 13 Drawing Sheets

PIEZOELECTRIC-DRIVEN MEMS ELEMENT

CROSS REFERENCE TO RELATED APPLICATION

This application is based upon and claims the benefit of priority from the Japanese Patent Application No. 2009-082270, filed on Mar. 30, 2009, the entire contents of which are incorporated herein by reference.

FIELD OF THE INVENTION

The present invention relates to the MEMS (Micro-electromechanical System) element with a piezoelectric drive mechanism using a piezoelectric thin film.

DESCRIPTION OF THE BACKGROUND

Methods for manufacturing a MEMS variable capacitor and a MEMS switch using a MEMS actuator draw increasing attention. MEMS elements are expected to be applied to the MEMS variable capacitor and MEMS switch for high frequency technical field such as cellular phones, automobile telephones, etc. for the following reasons. The MEMS variable capacitor has a higher Q value than a semiconductor variable capacitor conventionally used. The MEMS switch has a lower loss when the switch is ON and a higher insulating characteristic when the switch is OFF than a semiconductor switch conventionally used.

JP-A 2007-259669 discloses a piezoelectric actuator without slits in order to reduce warpage of the beam thereof due to a residual strain. The strength of the beam increases by employing a slit-less structure of a lower electrode film of the beam. This makes the warpage of the beam difficult. However, the piezoelectric actuator has a problem that the operating voltage thereof increases in accordance with an increase in the strength of the beam. JP-A 2008-005642 (corresponding to U.S. Patent Application Publication 20080042521A1) discloses a piezoelectric actuator with a folded beam structure. The folded structure allows it to cancel out the warpage of the beam. However, the actuator has another problem that the resistance of the electrode film lengthened owing to the folded structure increases the output signal loss thereof and decreases the Q value thereof.

In order to reduce the loss of variable capacitors and the passing loss of switches, it is suggested that the resistance of the electrode film is lowered. As specific methods for reducing the resistance of the electrode film of a piezoelectric-driven MEMS element, employing a low resistivity material for the electrode films, shortening the length of the electrode films, widening the width of the electrode films, and thickening the electrode films are suggested on the basis of $R=\rho \cdot (L/w \cdot t)$.

However, Al, Cu, Mo, etc. are currently employed for the electrode films. This gives rise to a small range of choice among the above methods. The length of the electrode films is shortened to increase the operating voltage of the actuator in proportion to the square of the length thereof. The width of the electrode films is widened to make the beam warp easily in a width direction of the electrode films, the beam being hard to bend. There also exists a problem that the operating voltage increases in proportion to the thickness of the electrode film. Lowering the resistances of the electrode films gives rise to a risk of deteriorating the characteristics of variable capacitors or switches. Therefore, it has been difficult to raise Q value of the piezoelectric-driven MEMS element by lowering the resistances of the electrode films.

SUMMARY OF THE INVENTION

According to a first aspect of the invention, a piezoelectric-driven MEMS element includes a substrate, a beam, a fixed portion, a fixed electrode portion and a power source. The beam is provided with a lower electrode film, a lower piezoelectric film formed on the lower electrode film, a middle electrode film formed on the lower piezoelectric film, an upper piezoelectric film formed on the middle electrode film and an upper electrode film formed on the upper piezoelectric film. The fixed portion fixes one end of the beam onto the substrate so as to hold at least a portion of the beam with a gap above the substrate. The fixed electrode portion is arranged on the substrate, and has a capacitive gap between the fixed electrode portion and the other end of the beam. The power source applies a voltage between the lower electrode film and the middle electrode film of the beam, and between the upper electrode film and the middle electrode film of the beam. In addition, at least one or two of the lower electrode film, the middle electrode film and the upper electrode film is thicker than the rest thereof.

According to a second aspect of the invention, another piezoelectric-driven MEMS element includes a substrate, a beam, a fixed portion, a fixed electrode portion and a power source. The beam has a lower electrode film, a lower piezoelectric film formed on the lower electrode film, a middle electrode film formed on the lower piezoelectric film, an upper piezoelectric film formed on the middle electrode film and an upper electrode film formed on the upper piezoelectric film. The fixed portion is arranged on the substrate, and fixes one end of the beam so as to hold at least a portion of the beam with a gap above the substrate. The fixed electrode portion is arranged on the substrate, and has a capacitive gap between the fixed electrode portion and the other end of the beam. The power source applies a voltage between the lower electrode film and the middle electrode film of the beam, and between the upper electrode film and the middle electrode film of the beam. In addition, the lower electrode film and the upper electrode film are prevented from being in contact with the middle electrode film.

According to a third aspect of the invention, another piezoelectric-driven MEMS element includes a substrate, a forward beam, a backward beam, a connection portion, a fixed portion, a fixed electrode and a power source. The forward and backward beams are arranged in a line symmetry, and are provided with a lower electrode film, a lower piezoelectric film formed on the lower electrode film, a middle electrode film formed on the lower piezoelectric film, an upper piezoelectric film formed on the middle electrode film and an upper electrode film formed on the upper piezoelectric film. The connection portion connects the middle electrode film of the forward beam to the upper electrode film and the lower electrode film of the backward beam, and the upper electrode film and the lower electrode film of the forward beam to the middle electrode film of the backward beam. The fixed portion is arranged on the substrate and on a side opposite to the connection portion of the forward beam, and fixes an end of the forward beam to hold at least a portion thereof with a gap above the substrate. The fixed electrode is arranged on the substrate, and has a capacitive gap between the fixed electrode portion and the other end of the beam. The power source applies a voltage between the lower electrode film and the middle electrode film of the beam, and between the upper electrode film and the middle electrode film of the beam. In addition, the middle electrode film is thicker than the lower electrode film and the upper electrode film.

BRIEF DESCRIPTION OF DRAWINGS

The accompanying drawings, which are incorporated in and constitute a part of this specification, illustrate embodiments of the invention and together with the description, serve to explain the principles of the invention.

DETAILED DESCRIPTION OF THE EMBODIMENTS

Figure 1:
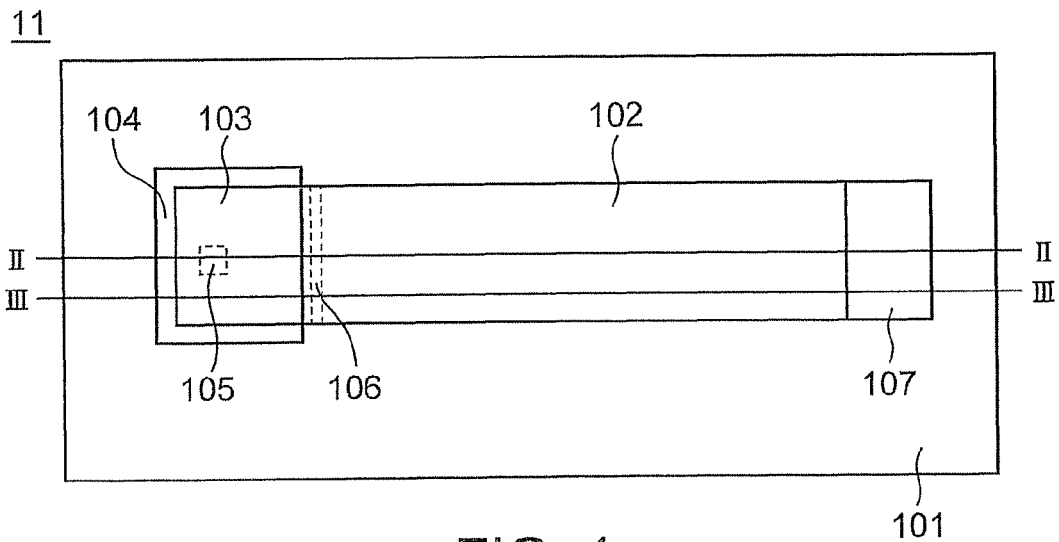
FIG. 1 is a conceptual view illustrating a piezoelectric-driven MEMS element of which middle electrode film is made thicker than upper and lower electrode films thereof.

The Q value of a variable capacitor is increased, or the loss of a switch is decreased by at least one of the following two ways. One is to thicken the electrode films which output signals for reducing the resistances thereof. The other is to parallelize the electrode films which output signals for reduce the resistances thereof.

First, a configuration of a piezoelectric-driven MEMS element is explained briefly. A rectangular piezoelectric-driven MEMS element is provided with a fixed electrode and a beam (an actuator and a movable electrode) on a substrate. The piezoelectric actuator and the movable electrode include a lower electrode film, a lower piezoelectric film, a middle electrode film, an upper piezoelectric film, and an upper electrode film as the main components thereof. The substrate is provided with the movable electrode which is held with a gap above the substrate by a fixed portion. When a voltage is applied to the piezoelectric films to make the piezoelectric films expand and contract, the actuator is bent to be displaced. This behavior further changes a distance between the fixed electrode and the movable electrode to allow the MEMS element to serve as a variable capacitor or a switch.

A configuration of another piezoelectric-driven MEMS element is explained briefly. The piezoelectric-driven MEMS element of the folded type is provided with a fixed electrode, a forward beam (a piezoelectric actuator) and a backward beam (a piezoelectric actuator and a movable electrode) on a substrate. And the beams are arranged in a line. And the beams have connections which connect the ends of these actuators. The actuator and the movable electrode include a lower electrode film, a lower piezoelectric film, a middle electrode film, an upper piezoelectric film, and an upper electrode film as the main components. Alternatively, the piezoelectric-driven MEMS element of the folded type has the same actuators as those mentioned above, etc. arranged in parallel in a line-symmetry.

When a voltage is applied to the piezoelectric films of the piezoelectric-driven MEMS element as mentioned above, the beam is bent to be displaced. This behavior changes a distance between the fixed electrode and the movable electrode. Such a change in the distance allows the MEMS element to serve as a variable capacitor or a switch.

Then, conditions of the electrode films are explained to raise the characteristics, i.e., the Q value of the MEMS variable capacitor and the loss of the MEMS switch. The electrode film is thickened to reduce the resistance thereof. In this case, it is preferable to thicken an electrode film which outputs a signal, as the resistance of the electrode film is relevant to a loss of the signal. It is not preferable to thicken an electrode film which does not output a signal. Because, the thick electrode film which does not output a signal reduces not only the resistance of the electrode film which outputs a signal, but also the bend performance of the beam. This leads to an increase in the operating voltage of the MEMS element. However, when an actuator with two or more electrode films and the thicknesses of the films are changed, the electrode films which do not output a signal may be also made thicker for the reason of the performance of the beam driven piezoelectrically.

Two or more electrode films which output a signal are arranged in parallel to reduce the total resistance of the electrode films. When the circuit of the actuator is taken into account, the upper and lower electrode films are shunted to output a signal from both electrode films. This allows it to reduce the total resistance of interconnections which output a signal, e.g., in a bimorph MEMS element.

Limitation of Connecting Positions

In the piezoelectric-driven MEMS element provided with the folded beam including a forward beam and a backward beam, the total resistance of the interconnections which output a signal can be made small by providing a plurality of the forward electrode films which output a signal, and also by thickening the backward electrode films. In view of the circuit of the actuator, e.g., of the bimorph MEMS, outputting a signal from both the upper and lower electrode films of the forward beam which are shunted, and outputting a signal from the thickened middle electrode film of the backward beam reduce the total resistance of the interconnections to output a signal. Alternatively, the electrode films of the forward and backward beams to output a signal may be opposite to the way in the example mentioned above.

The materials used for electrode films and interconnections to connect the electrode films to each other are preferably Al, Cu, or Mo in view of the characteristic of the piezoelectric-driven MEMS element.

The materials used for the fixed electrodes should just have conductivity to some extent. Specifically, transition metals (Ti, Ni, Fe, Cu, Mo, W, Ta, etc.), noble metals (Ag, Au, Pt, Ir, etc.), oxide thin films (ITO, YBCO, $ReO_6$, etc.), and organic conductive polymer, etc. are quoted. As the piezoelectric material, publicly known piezoelectric materials, such as AlN and polyvinylidene fluoride, can be employed.

When thickening an electrode film which outputs a signal, it is preferable to thin electrode films other than the electrode film. Thinning the electrode films which do not output a signal can prevent the Q value from lowering. The thinning thus reduces a decline of the bend performance of the beam. When thickening the electrode films which output a signal of the piezoelectric-driven MEMS element, it is not preferable to make the electrode films which output a signal 1.5 times thicker than all the electrode films of a piezoelectric-driven MEMS element of which electrode films all have the same thickness, because the thickening significantly affects the Q value owing to the reduction in the resistivity of the electrode films. It is preferable that the ratio of the thickness of the electrode films which do not output a signal to the thickness of the electrode films which output a signal is 1:1.5 or more. It is not preferable to make the ratio less than this ratio, 1:1.5, because the effect of thickening the electrode films is small.

Next, the configuration of the piezoelectric-driven MEMS element is briefly explained for thickening the electrode films. In addition, the configuration of, e.g., the bimorph piezoelectric-driven MEMS element is explained for thickening the middle electrode film or the upper and lower electrode films thereof. The electrode films to be thickened may be modified according to embodiments of the piezoelectric-driven MEMS element.

In addition, if there is no separation portion to separate the lower electrode in the beam, the movable electrode also bends similarly to the piezoelectric actuator. If there is a separation portion to separate the lower electrode therein, the lower and upper electrode films of the movable electrode portion do not configure a circuit for elongating and contracting the lower piezoelectric layer.

FIG. 1 is a conceptual view illustrating a piezoelectric-driven MEMS element of which middle electrode film is made thicker than the upper and lower electrode films thereof. The piezoelectric-driven MEMS element 11 shown in FIG. 1 includes a variable capacitor or a switch configured by a fixed electrode 104 with an insulating film 108 thereon and a lower electrode film 123 of a movable electrode to output a signal through the lower electrode film 123 of the movable electrode, an interconnection 105, and a middle electrode film 122 of the actuator. Since the lower electrode film is configured to be separated by a separation portion 106 onto two sides of the movable electrode and the actuator, a signal from the variable capacitor or switch does not pass through an upper electrode film 131 or a lower electrode film 133 on the side of the actuator. Alternatively, two or more interconnections may be provided. The piezoelectric-driven MEMS element 11 shown in FIG. 1 has a reduced resistivity of the middle electrode films 122 and 132 due to the thickening thereof. Accordingly, a signal is output through the middle electrode films 122 and 132 to allow it to lower the loss of the output signal for the piezoelectric-driven MEMS element 11. For example, the Q value of the piezoelectric-driven MEMS element (a variable capacitor) whose middle electrode film has a thickness of $2t_1$ is 1.4 times that of the piezoelectric-driven MEMS element whose middle electrode film has a thickness $t_1$. Even thickening the middle electrode film results in a comparatively small increase in the operating voltage of the MEMS element. Therefore, even when the element is operated as a variable capacitor or a switch with an operating voltage of 3V to 5V or less, the thickening of the middle electrode film has little influence on the operating voltage thereof.

Figure 6:
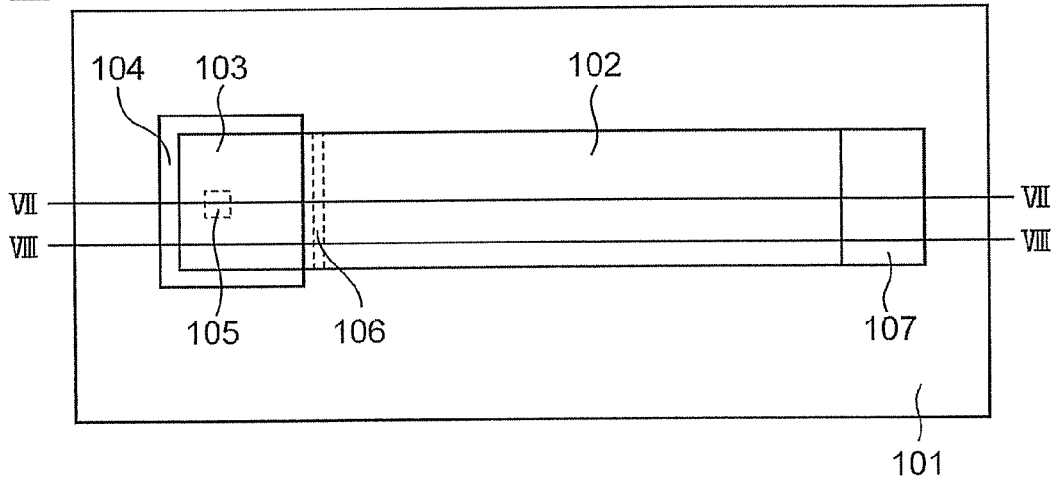
FIG. 6 is a conceptual view illustrating a configuration of a modified example of a piezoelectric-driven MEMS element of a first example.

FIG. 6 is a conceptual view illustrating a piezoelectric-driven MEMS element 13 with the upper and lower electrode films thicker than the middle electrode film thereof. The piezoelectric-driven MEMS element 13 shown in FIG. 6 includes a variable capacitor or a switch configured by the fixed electrode 104 with the insulating film 108 thereon and the lower electrode film 123 of the movable electrode to output a signal therethrough, an interconnection 105, an upper electrode film 121, and an upper electrode film 131 of the actuator in this order. Since the lower electrode film is configured to be separated by the separation portion 106 onto two sides of the movable electrode and the actuator, a signal from the variable capacitor or switch does not pass through the middle electrode film 122 on the side of the movable electrode, the middle electrode film 132 and the lower electrode film 133 on the side of the actuator. Alternatively, two or more interconnections may be provided, but the interconnections are connected to neither the middle electrode film 122 nor 123. The upper electrode films 121 and 131 are thickened to lower the resistivity thereof for the piezoelectric-driven MEMS element 13 as shown in FIG. 6. Therefore, the signal loss of the piezoelectric-driven MEMS element 13 can be reduced by thickening the upper and lower electrode films. The degree of the signal loss of the piezoelectric-driven MEMS element can change with the position and number of the interconnections thereof in some cases. When the lower electrode films 123 and 133 without relevance to the signal output are not thickened, the bending symmetry of the MEMS element lowers, and the signal loss thereof lowers as well.

In the piezoelectric-driven MEMS element where the upper and lower electrode films were made thicker than the middle electrode film, thickening the upper and lower electrode films degrades the bending performance of the beam more significantly than thickening the middle electrode film. In this case, however, thinning the middle electrode film can suppress the degradation of the bending performance of the beam to some extent.

Figure 10:
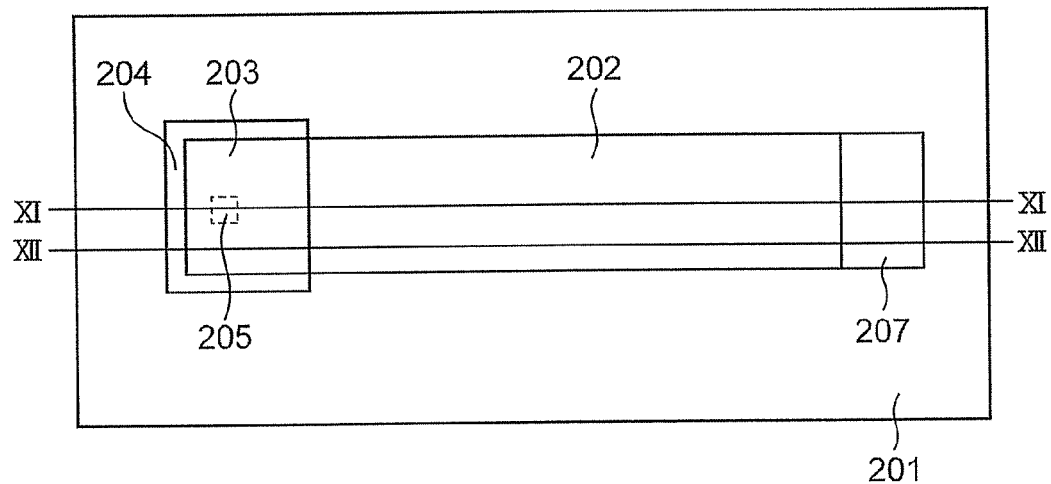
FIG. 10 is a schematic plane view illustrating a configuration of a piezoelectric-driven MEMS element according to a second example of the invention.

FIG. 10 is a conceptual view illustrating a piezoelectric-driven MEMS element where either one of the upper, middle and lower electrode films are made not to output a signal thereof, but both upper and lower electrode films are made to output. In the piezoelectric-driven MEMS element 14 shown in FIG. 10, a variable capacitor or a switch is regarded to be configured by a fixed electrode 204 with an insulating film 208 thereon and a lower electrode film 223 of a movable electrode, the lower electrode film 223 and an upper electrode film 221 of the movable electrode being connected to each other by an interconnection 205. Then, a signal through the variable capacitor or switch is output via the parallel-connected electrode films of the upper electrode film 231 and the lower electrode film 233 of the actuator. The middle electrode films 222 and 232 are configured to be separated from the upper electrode films 221, 231, the lower electrode films 223, 233 and the interconnection 205. Alternatively, two or more interconnections may be provided, but neither of the interconnections is connected to the middle electrode films. Since electrode films to output a signal are parallel-connected, the total resistance thereof decreases. Therefore, such a piezoelectric-driven MEMS element 14 has a low loss of the output signal. In this piezoelectric-driven MEMS element 14 shown in FIG. 5, the upper and lower electrode films may be thickened to reduce the resistance of the electrode film to output a signal. The middle electrode film may be made thin to enhance the bending performance of the beam.

Figure 16:
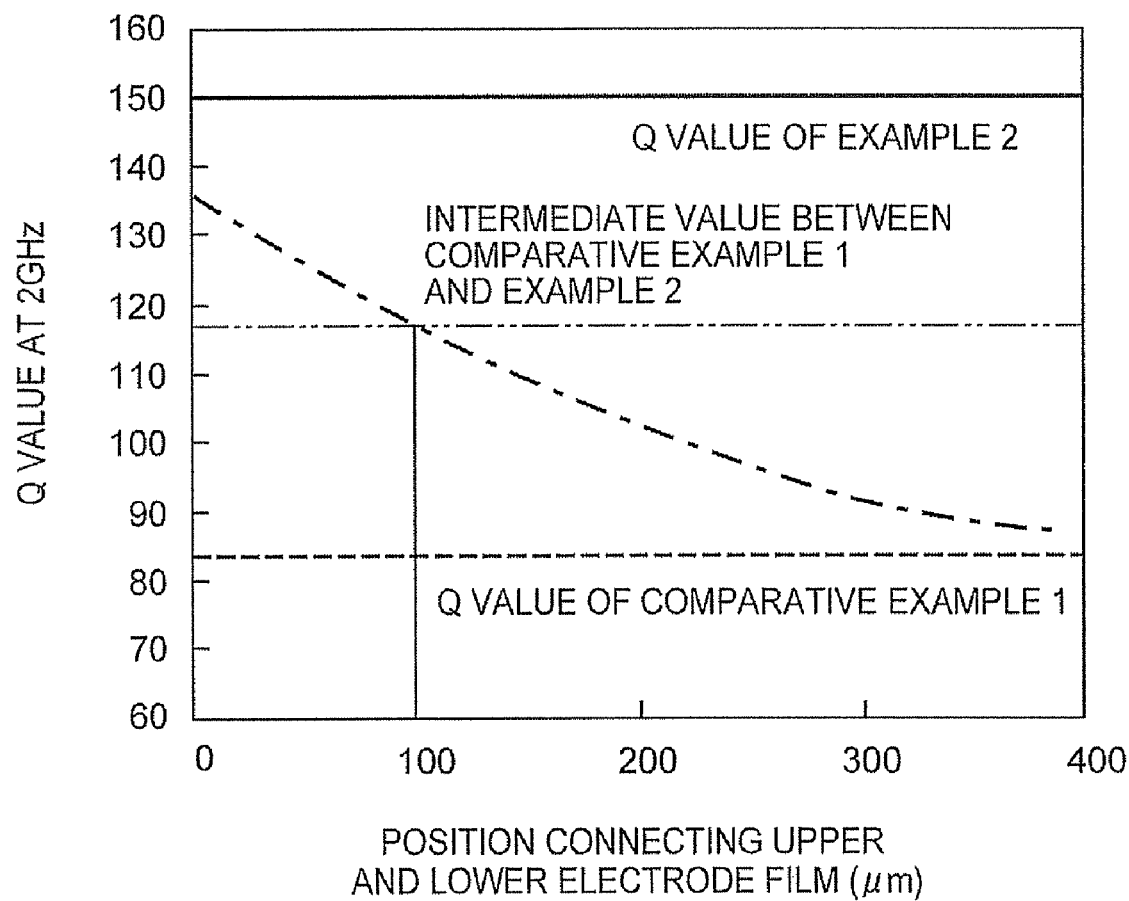
FIG. 16 is a graph illustrating a variation in the Q value of a piezoelectric actuator with respect to a connecting position of lower and upper electrode films thereof.
Figure 17:
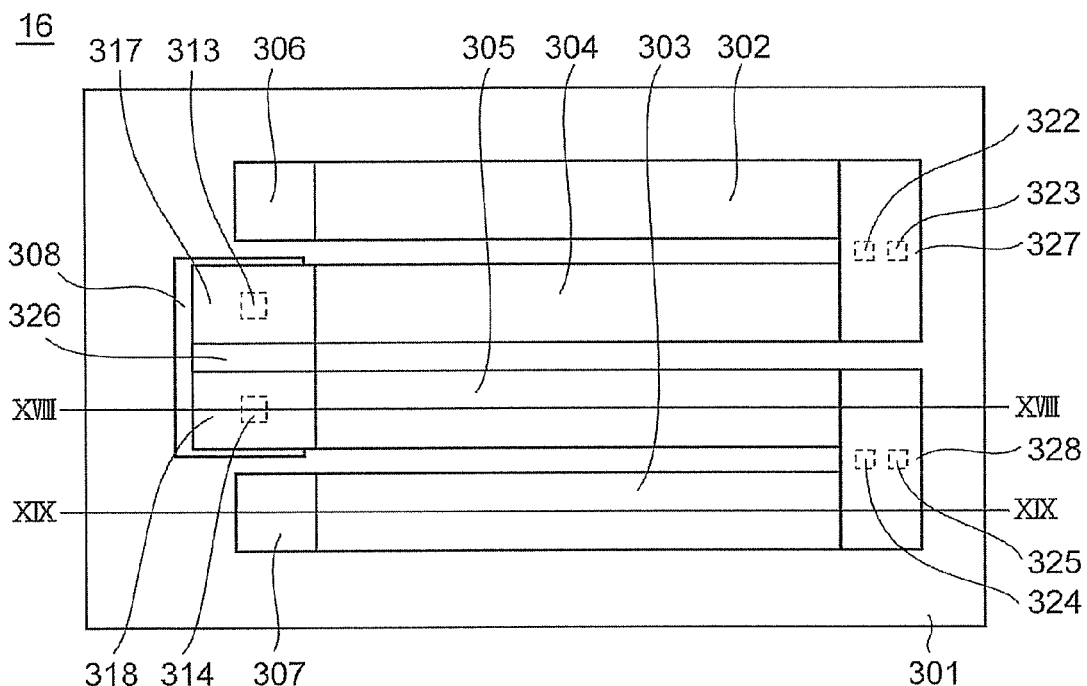
FIG. 17 is a conceptual view illustrating a configuration of a piezoelectric-driven MEMS element according to a third example.

FIG. 17 is a conceptual view illustrating a piezoelectric-driven MEMS element 16 provided with a folded structure having forward beams 304, 305 and backward beams 302, 303, where the middle electrode film outputs a signal from the forward beam, and is made thicker than the upper and lower electrode films. In addition, both the upper and lower electrode films output a signal from the backward beam therein. The piezoelectric-driven MEMS element 16 shown in FIG. 16 is provided with connection portions 327, 328 and a fixed electrode 308, the connection portions 327, 328 connecting the forward beams (actuator 304, 305) and the backward beams (movable electrode portions 317, 318 and actuators 302, 303), the forward beams having one end fixed to fixed portions 306, 307 on a substrate 301.

At the connection portions 327, 328:
upper and lower electrode films 351, 353, 361, 363 of the actuator for the forward beam, and middle electrode films 372, 382 of the actuator for the backward beam are connected to each other; and
middle electrode films 352, 362 of the forward beam and upper and lower electrode films 371, 373, 381, 383 of the backward beam are connected so as to make a signal circuit and a circuit for applying a voltage to piezoelectric films operate.

Such a configuration allows it to easily eliminate a residual strain of the piezoelectric films and to reduce the resistance of the electrode films. The configuration also allows it to suppress the signal losses of both the forward and backward beams owing to a method for lowering the resistances of two kinds of electrode films even if the interconnections to output a signal are exchanged at the connection portions 327, 328. Independently lowering the respective resistances of the electrode films to output a signal to the forward and backward beams allows it to reduce the signal losses synergistically. For example, the middle electrode films are thickened in the forward beams to lower the resistances thereof, while the lower and upper electrode films are connected to each other in the backward beam to lower the resistances thereof, and vice versa. Alternatively, independently lowering the respective resistances of the electrode films to output a signal to either one of the forward and backward beams also allows it to reduce the signal losses.

Figure 26:
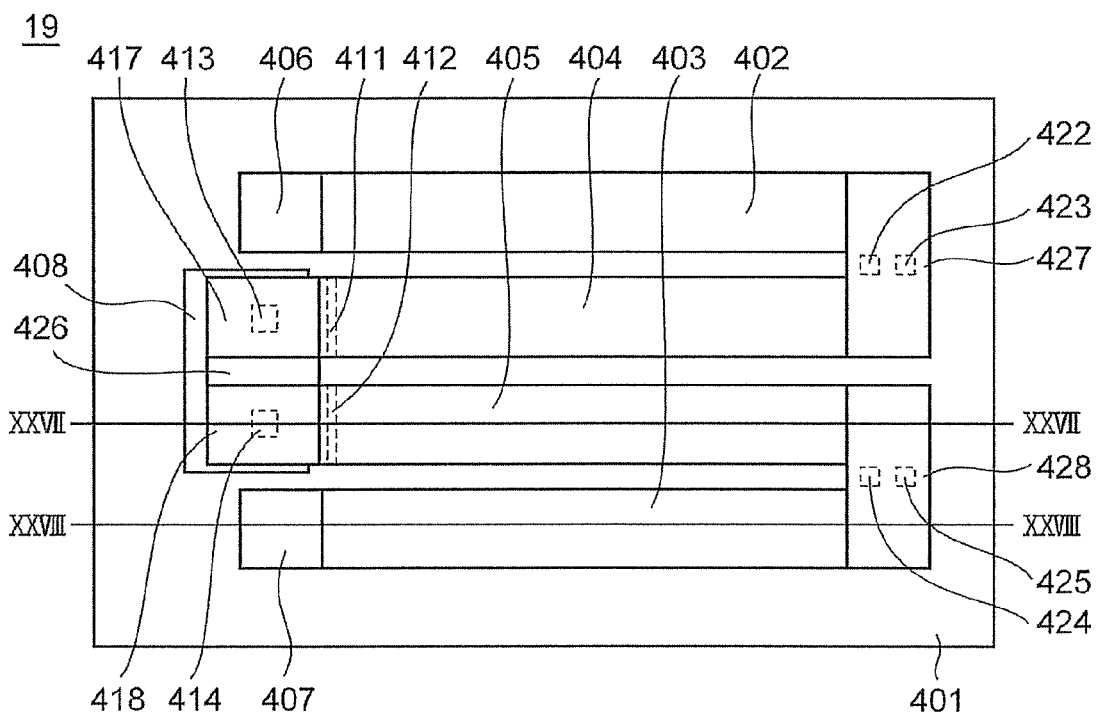
FIG. 26 is a conceptual view illustrating a piezoelectric-driven MEMS element provided with a folded structure having a forward beam and a backward beam.

FIG. 26 is a conceptual view illustrating a piezoelectric-driven MEMS element 19 provided with a folded structure having a forward beam and a backward beam, where the middle electrode film to output a signal of the backward beam is thicker than both the upper and lower electrode films to output a signal of the forward beam. The steps in the method to reduce a resistance of electrode films each to output a signal to the forward and backward beams is reverse to that in the method mentioned with respect to FIG. 17. The configuration of the piezoelectric-driven MEMS element 19 is the same as that shown FIG. 17, except a reverse wiring manner at the connection portion thereof. Also in the present configuration, independently lowering the respective resistances of the electrode films to output a signal to the forward and backward beams allows it to reduce the signal losses synergistically. Alternatively, independently lowering the respective resistances of the electrode films to output a signal to either one of the forward and backward beams also allows it to reduce the signal losses in the configuration.

When AlN is employed for the piezoelectric films, it is not preferable to set the thickness of the electrode film to a thickness exceeding 1.0 μm, because the operating voltage of the MEMS element increases. When the piezoelectric-driven MEMS element of the present invention is applied to a frequency modulation circuit for wireless devices such as a cellar phone, etc. to be required to operate for a long time with a small battery, the MEMS element is required particularly to be small with low-voltage operation, low loss and low power consumption. Consequently, it is more preferable that the thickness of the electrode films to output a signal is 0.6 μm or less. The piezoelectric-driven MEMS element meeting the requirements mentioned above is capable of operating with a low voltage and much lower losses of output signals as well as conventional MEMS elements.

The present invention is explained according to examples below. Alternatively, the following examples and the piezoelectric-driven MEMS element included in the scope of the invention may be applied to both a variable capacitor and a switch.

EXAMPLES

First Example

Figure 2:
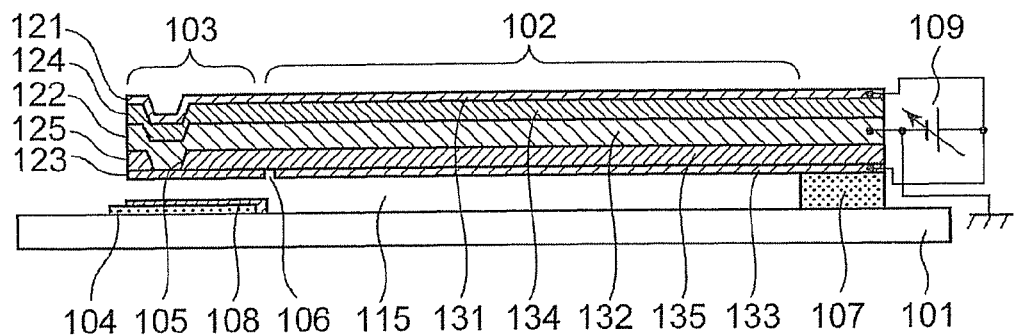
FIGS. 2 and 3 are sectional views cut along lines II-II and of FIG. 1, respectively.
Figure 3:
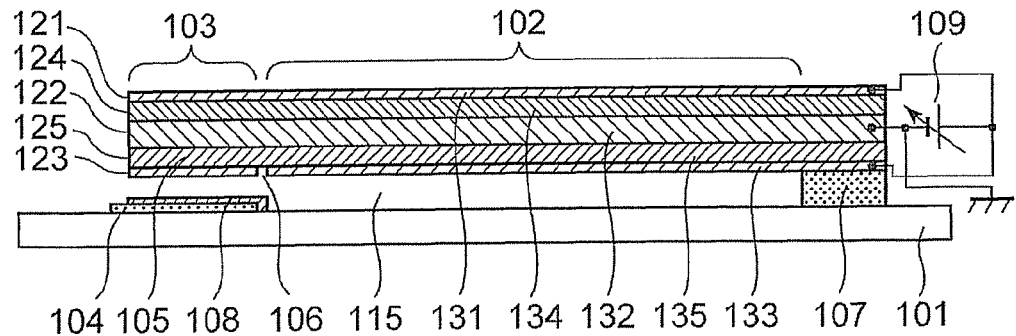

FIG. 1 is a schematic plane view illustrating a configuration of a piezoelectric-driven MEMS element 11 according to a first example. FIGS. 2 and 3 are sectional views cut along the lines II-II and III-III of FIG. 1, respectively. As conceptually shown in FIG. 1, the piezoelectric-driven MEMS element 11 according to the first embodiment is provided with a beam arranged on the principal surface of a substrate 101 and an actuator 102 extending from a fixed portion 107 to a movable electrode portion 103. And the fixed portion 107 is connected to the substrate 101, a gap 115 is provided above the principal plane of the substrate 101 to support the actuator 102 and the movable electrode portion 103. And a fixed portion 104 is formed on the principal surface of the substrate 101 so as to face the movable electrode portion 103 with a capacitive gap between the fixed portion 104 and the movable electrode portion 103, and an insulating film 108 is further formed on the fixed electrode portion 104.

The piezoelectric actuator 102 is formed of a lower electrode film 133, a lower piezoelectric film 135 formed on the lower electrode film 133, a middle electrode film 132 formed on the lower piezoelectric film 135, an upper piezoelectric film 134 formed on the middle electrode film 132 and an upper electrode film 131 formed on the upper piezoelectric film 134. A voltage is applied with a battery 109 between the lower electrode film 133 and the middle electrode film 132 of the beam, and between the upper electrode film 131 and the middle electrode film 132 of the beam to bend and displace the piezoelectric actuator 102 perpendicularly to the principal plane of the substrate 101. The movable electrode portion 103 is also bent and displaced in accordance with the bend and displacement of the piezoelectric actuator 102. The middle electrode films 122,132 of the piezoelectric actuator 102 and the movable electrode portion 103 has a thickness two times that of the lower electrode films 123, 133 and the upper electrode films 121, 131.

The movable electrode portion 103 has a laminated structure as well as the piezoelectric actuator 102, while the lower electrode film 123 and the middle electrode film 132 are electrically connected to each other by the interconnection 105 within the movable electrode 103. And there exist the following connections:

The lower piezoelectric film 125 of the movable electrode portion 103 is connected to the lower piezoelectric film 135 of the piezoelectric actuator 102;
the middle electrode film 122 of the movable electrode portion 103 is connected to the middle electrode film 132 of the piezoelectric actuator 102; the upper piezoelectric film 124 of the movable electrode portion 103 is connected to the upper piezoelectric film 134 of the piezoelectric actuator 102; and
the upper electrode film 121 of the movable electrode portion 103 is connected to the upper electrode film 131 of the piezoelectric actuator 102. On the other hand, the lower electrode film 123 of the movable electrode portion 103 is separated from the lower electrode film 133 of the piezoelectric actuator 102 by the separation portion 106 thereof so as not to shunt the lower electrode film 133 and the middle electrode film 132 of the piezoelectric actuator 102.

Concerning the dimensions of the respective portions of the piezoelectric actuator 102:
the length of the piezoelectric actuator is 400 μm;
the width of the piezoelectric actuator is 60 μm;
the length of the movable electrode portion 103 is 100 μm;
the width of the movable electrode portion is 60 μm;
the length of the fixed electrode portion is 120 μm;
the width of the fixed electrode portion is 60 μm;
the length of the fixed portion 107 is 40 μm;
the width of the fixed portion 107 is 60 μm;
the thickness of the lower electrode films 123, 133 is 0.2 μm;
the thickness of the lower piezoelectric films 125, 135 is 0.5 μm;
the thickness of the upper piezoelectric films 124, 134 is 0.5 μm;
the thickness of the upper electrode films 121, 131 is 0.2 μm;
the thickness of the insulating film 108 is 0.1 μm;
the thickness of the middle electrode film is 0.4 μm;
the length of the interconnection 105 is 20 μm; and
the width of the separation portion 106 is 10 μm.

In addition, the lower electrode films 123, 133, the middle electrode films 122, 132, the upper electrode films 121, 131 and the fixed electrode portion 104 include Al (aluminum). The lower piezoelectric film 125, 135, the upper piezoelectric film 124, 134 and the insulating film 108 include AlN.

As mentioned above, since the fixed electrode portion 104 and the movable electrode portion 103 are arranged to face each other, a capacitor (the capacitive gap) is formed between the fixed electrode portion 104 and the lower electrode film 103 of the movable electrode portion 103. In addition, since the movable electrode portion 103 is also displaced in accordance with the displacement of the piezoelectric actuator 102, the capacitor formed by the lower electrode film 123 of the movable electrode portion 103 serves as a variable capacitor.

Concerning a signal flow in the piezoelectric-driven MEMS element 11, the signal input to the fixed electrode portion 104 passes over a capacitor formed by the lower electrode film 123 of the movable electrode portion 103, and further passes through the lower electrode film 123 of the movable electrode portion 103, the interconnection 105, the middle electrode film 122 of the movable electrode portion 103 and the middle electrode film 132 of the piezoelectric actuator 102 to be output to the outside.

The middle electrode films 122, 132 have the lowest resistance, as the middle electrode films 122, 132 are thicker than the lower electrode films 123, 133 and the upper electrode films 121, 131 as mentioned above. In this example, the signal loss becomes lower when the signal, which is input to the piezoelectric-driven MEMS element 10, is output to the outside through the middle electrode film 132 of the piezoelectric actuator 102 than when the signal is output to the outside through the lower electrode film 133 or the upper electrode film 131 of the piezoelectric actuator 102. This allows it to suppress a decrease in the Q value and an increase in an insertion loss during "ON" for the use of the variable capacitor and switch, respectively. A piezoelectric-driven MEMS element which has a middle electrode film with a thickness of 0.1 μm to 1.0 μm has been also fabricated.

First Comparative Example

Figure 4:
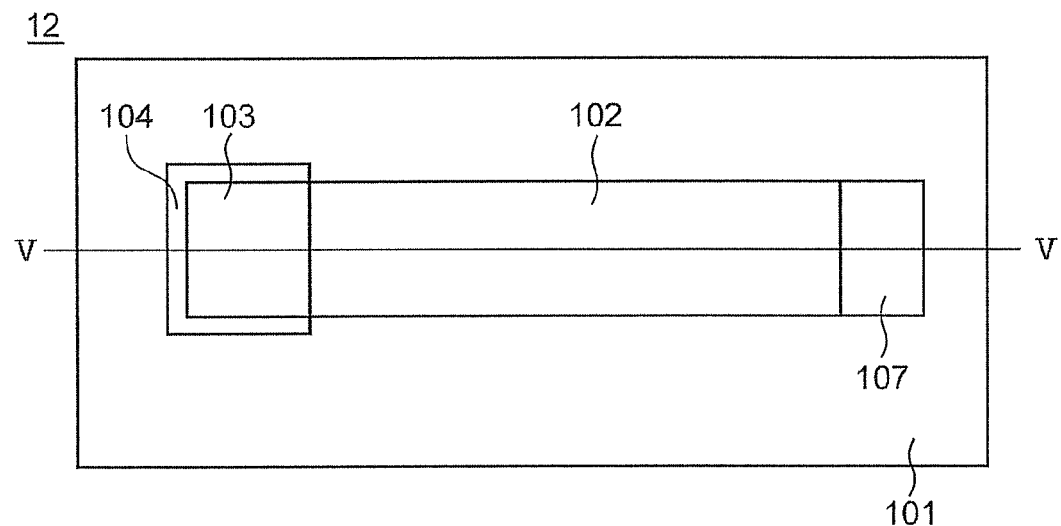
FIG. 4 is a conceptual view illustrating a configuration of a piezoelectric-driven MEMS element for which no measure is taken to suppress a loss of output signals.
Figure 5:
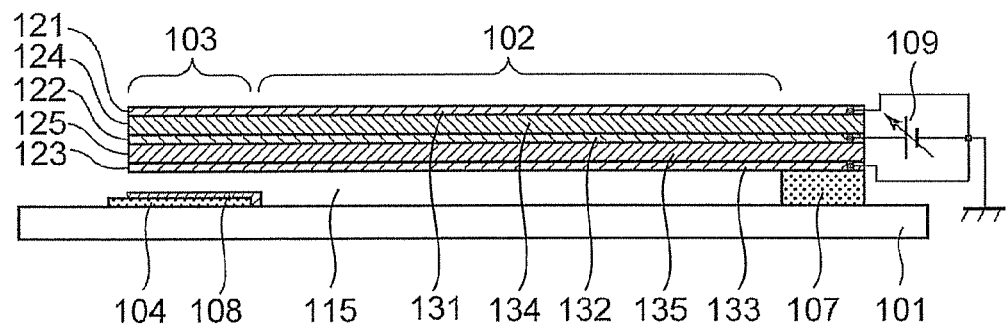
FIG. 5 is a sectional view cut along a line V-V of FIG. 4.

FIG. 4 is a conceptual view illustrating a configuration of a piezoelectric-driven MEMS element for which no measure is taken to suppress a loss of output signals. FIG. 5 is a sectional view cut along the line V-V of FIG. 4. As shown in FIGS. 4 and 5, the piezoelectric-driven MEMS element 12 according to the first comparative example is the same as the piezoelectric-driven MEMS element 11 of the first example, except that the thickness of the middle electrode film is 0.2 μm and there is neither the separation portion 106 nor the connection portion in the piezoelectric-driven MEMS element 12.

Concerning the flow of a signal of the piezoelectric-driven MEMS element 20, the signal input to the fixed electrode portion 104 passes over a capacitor formed by the lower electrode film 123 of the movable electrode portion 103, and further passes through the lower electrode film 133 of the movable electrode portion 103 of the piezoelectric actuator 102 to be output to the outside. That is, a different point is that a signal input is performed through the middle electrode film 132 or the lower electrode film 133 of the piezoelectric actuator 102. Here, as mentioned above, the middle electrode film 132 of the piezoelectric actuator 102 in the piezoelectric-driven MEMS element 12 has almost the same resistance as that of the lower electrode film 133 and the upper electrode film 131, as these three electrode films have the same thicknesses.

Comparison Between First Example and First Comparative Example

Table 1 lists the Q values at 2 GHz for the piezoelectric-driven MEMS element 11 of the first example and the piezoelectric-driven MEMS element 12 of the first comparative example for comparison. In addition, both capacitances of the variable capacitors are about 0.4 pF. Each Q value is calculated from the following expression (1).

TABLE 1

|  | Q value at 2 GHz |
| --- | --- |
| piezoelectric-driven MEMS element according to the first example | 164 |
| piezoelectric-driven MEMS element according to the first comparative example | 84 |

$$Q=Im(Y)/Re(Y) \qquad (1)$$

Here, Im (Y) is an imaginary part of admittance of the piezoelectric-driven MEMS element, and Re (Y) is a real part of the admittance. As shown in Table 1, the Q value of the piezoelectric-driven MEMS element 11 of the first example is about twice larger than that of the piezoelectric-driven MEMS element 12 of the first comparative example, as the movable electrode portion 103 is connected to an area with the thickest electrode film, i.e., the middle electrode film 112. Therefore, the piezoelectric-driven MEMS element 11 shown in the first example is understood to have the Q value enhanced effectively by thickening the electrode film for outputting a signal. It is clear that the similar configuration has an effect of suppressing an insertion loss during "ON" on a switch therewith. In addition, making thicker the middle electrode film in the first example allows it to further lower the signal loss of the piezoelectric-driven MEMS element.

First Modified Example

Figure 7:
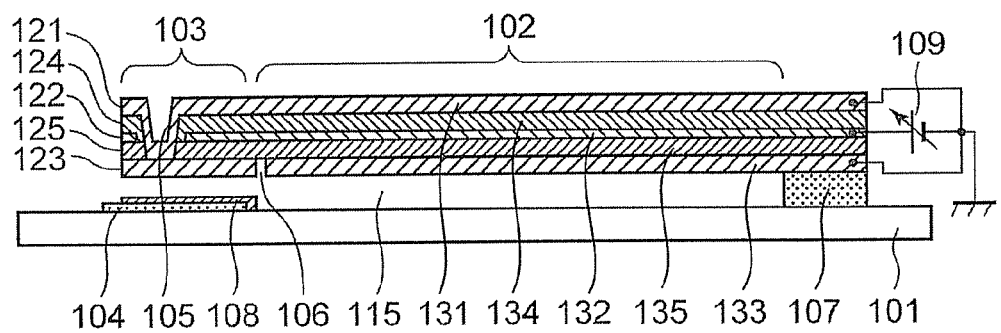
FIG. 7 is a sectional view cut along a line VII-VII of FIG. 6.
Figure 8:
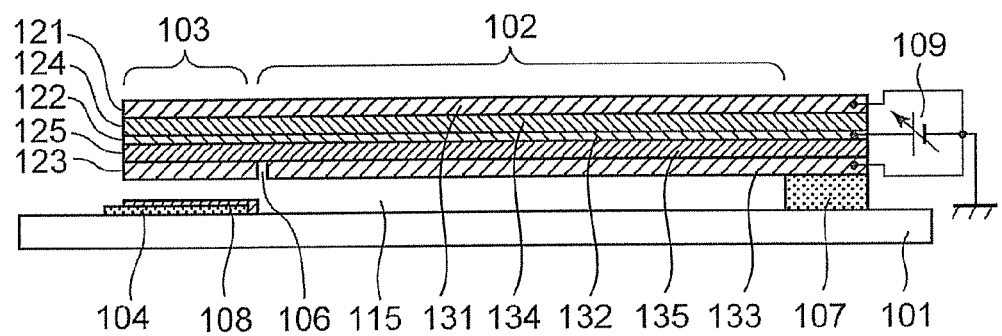
FIG. 8 is a sectional view cut along a line VIII-VIII of FIG. 6.

FIG. 6 is a conceptual view illustrating a configuration of a modified example of the piezoelectric-driven MEMS element 11 of the first example. FIG. 7 is a sectional view cut along the line VII-VII of FIG. 6. FIG. 8 is a sectional view cut along the line VIII-VIII of FIG. 6. In the piezoelectric actuator 102 and the movable electrode portion 103 of the piezoelectric-driven MEMS element 13 according to the first modified example, the lower electrode films 123, 133 and the upper electrode films 121, 131 are thicker than the middle electrode films 122, 132. Furthermore, the lower electrode film 123 and the upper electrode film 121 of the movable electrode portion are connected to each other via the interconnection 105. The piezoelectric-driven MEMS element 13 is the same as the piezoelectric-driven MEMS element 11 according to the first example, except these two configurations.

The signal, which is input to the piezoelectric-driven MEMS element 13, is output to the outside through the fixed electrode portion 104, the variable capacitor, the lower electrode film 123 of the movable electrode portion 103, the interconnection 105, the upper electrode film 121 of the movable electrode portion 103 and the upper electrode film 131 of the piezoelectric actuator 102, the variable capacitor being formed between the fixed electrode portion 104 and the movable electrode portion 103.

In the piezoelectric-driven MEMS element according to the first modified example, the signal, which is input to the piezoelectric-driven MEMS element 11, passes through the thickest electrode film of the piezoelectric actuator 102 as well as in the piezoelectric-driven MEMS element 13 according to the first modified example. This allows it to suppress a decrease in the Q value and an increase in an insertion loss during "ON" for the use of the variable capacitor and switch, respectively.

Comparison Between First Example and First Modified Example

Figure 9:
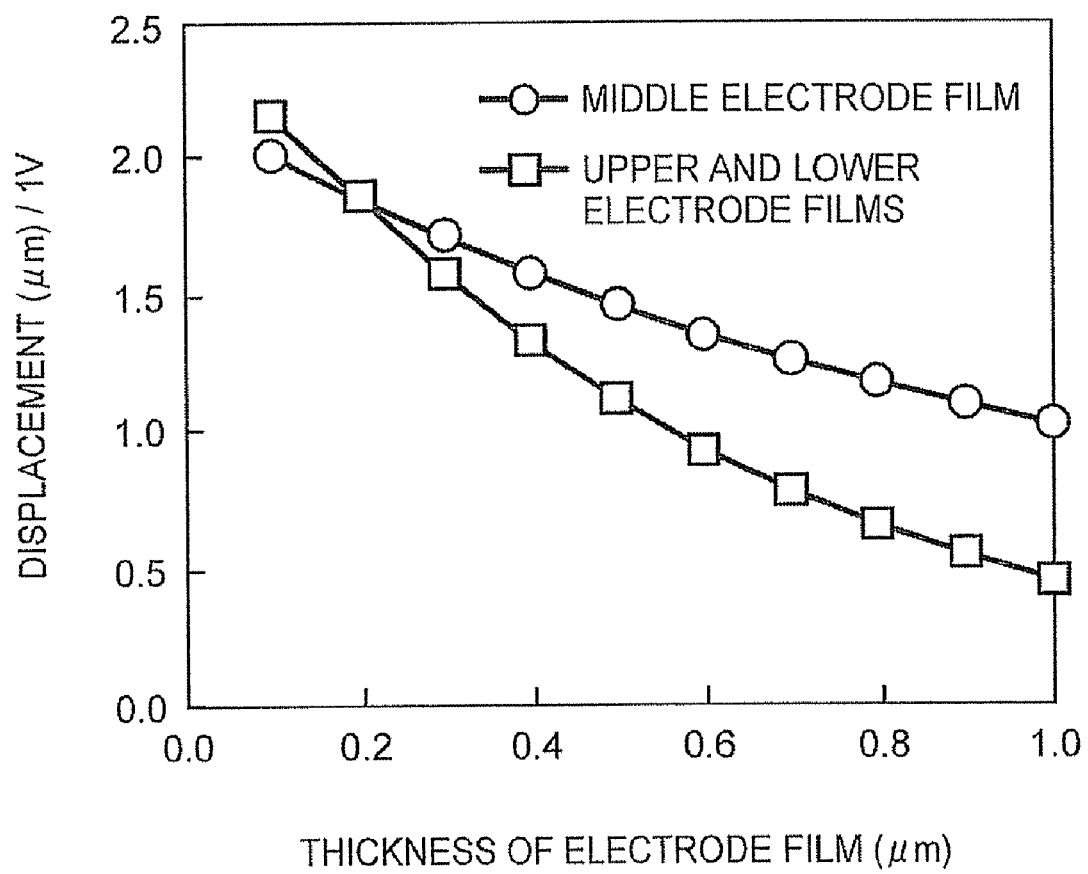
FIG. 9 is a graph illustrating a relationship between a thickness of an electrode film and a displacement of piezoelectric-driven MEMS elements of two examples.

Here, thickening the electrode films tends to suppress the displacement of the piezoelectric actuator 102. FIG. 9 is a graph illustrating a relationship between the thickness of the electrode film and a displacement of the piezoelectric-driven MEMS element of the first and second examples, the electrode film with a thickness of 0.1 to 1.0 µm being for outputting a signal, the displacement being taken at an operating voltage of 1 V. As is obvious from FIG. 9, thickening the lower and upper electrode films gives rise to a greater reduction in the displacement of the piezoelectric actuator 102 than thickening the middle electrode film. Therefore, the displacement of the piezoelectric actuator 102 around at 1 V taken into account, it is more preferable to output a signal to the middle electrode film, and to thicken the middle electrode film for the piezoelectric-driven MEMS element.

The lower electrode films 123, 133 and upper electrode films 121, 131 are thicker than the middle electrode films 122, 132 for the piezoelectric-driven MEMS element according to the first modified example. Alternatively, either one of the lower electrode films 123, 133 and upper electrode films 121, 131 may be thicker so as to make a signal which is input to the thicker electrode films pass therethrough. However, the laminated structure of the piezoelectric actuator 102 becomes asymmetric with respect to a direction perpendicular to the substrate 101. Therefore, it should be noted that the upward and downward displacements of the piezoelectric actuator 102 can differ from each other in some cases.

Second Example

Figure 11:
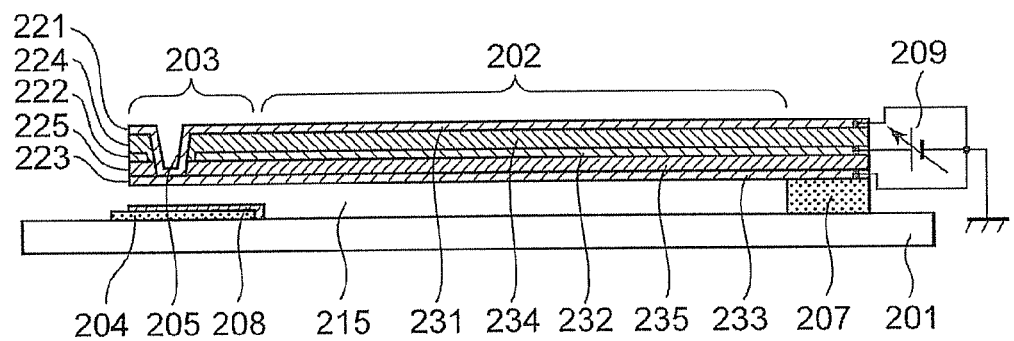
FIG. 11 is a sectional view cut along a line XI-XI of FIG. 10.
Figure 12:
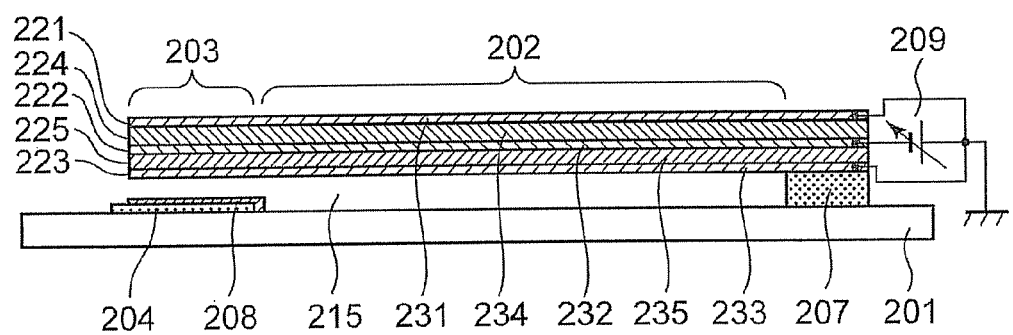
FIG. 12 is a sectional view cut along a line XII-XII of FIG. 10.

FIG. 10 is a schematic plane view illustrating a configuration of a piezoelectric-driven MEMS element 14 according to a second example of the invention. FIG. 11 is a sectional view cut along the line XI-XI of FIG. 10. FIG. 12 is a sectional view cut along the line XII-XII of FIG. 10. The piezoelectric-driven MEMS element 14 according to the second example is the same as the piezoelectric-driven MEMS element 11 of the first example, except the followings:

all the electrode films are same in thickness;

no separation portion is provided; and the lower electrode film 223 and the upper electrode film 221 are connected to each other through the interconnection 205.

Concerning a signal flow in the piezoelectric-driven MEMS element 14, the signal input to the fixed electrode portion passes over a capacitor (a capacitive gap) formed by the lower electrode film 223 of the movable electrode portion 203, and further passes through the lower and upper electrode films 223, 221 of the movable electrode portion 203, and the lower and upper electrode films 223, 231 of the piezoelectric actuator 202 to be output to the outside. That is, since the input signal passes through the lower and upper electrode films 223, 231 of the piezoelectric actuator 202, the total resistance thereof lowers.

TABLE 2

| | Q value at 2 GHz |
|---|---|
| piezoelectric-driven MEMS element according to second example | 153 |
| piezoelectric-driven MEMS element according to first comparative example | 84 |

Comparison Between Second Example and First Comparative Example

Table 2 lists the Q values for the variable capacitors of the first comparative example and the second example for comparison. As shown in Table 2, the Q value of the piezoelectric-driven MEMS element 14 of the second example is larger than that of the piezoelectric-driven MEMS element 12 of the first comparative example, as the movable electrode portion 203 is connected to the lower and upper electrode films 223, 231 of the piezoelectric actuator 202. Therefore, the piezoelectric-driven MEMS element 14 shown in the second example is understood to effectively suppress a reduction in the Q value of the variable capacitor. It is clear that the similar configuration has an effect of suppressing an insertion loss during "ON" on a switch therewith.

Second Modified Example

Figure 13:
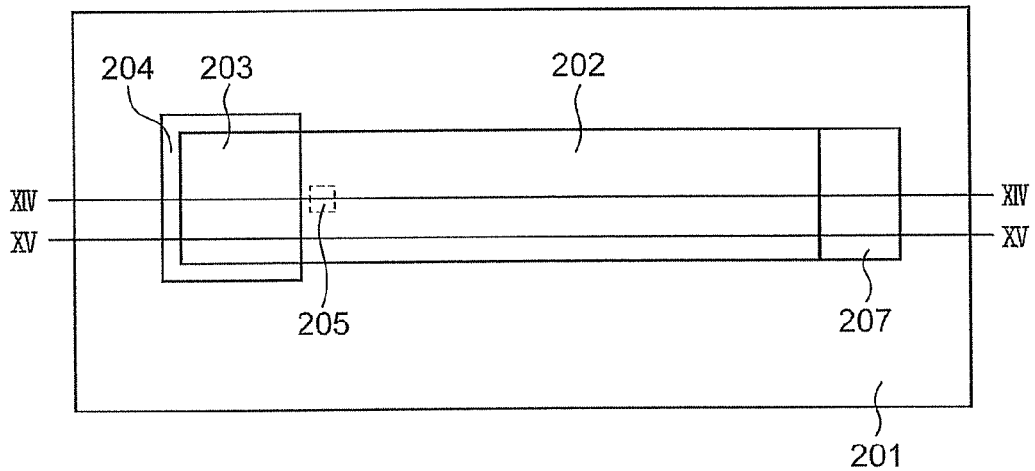
FIG. 13 is a conceptual view illustrating a configuration of a second modified example for a piezoelectric-driven MEMS element of the second example.
Figure 14:
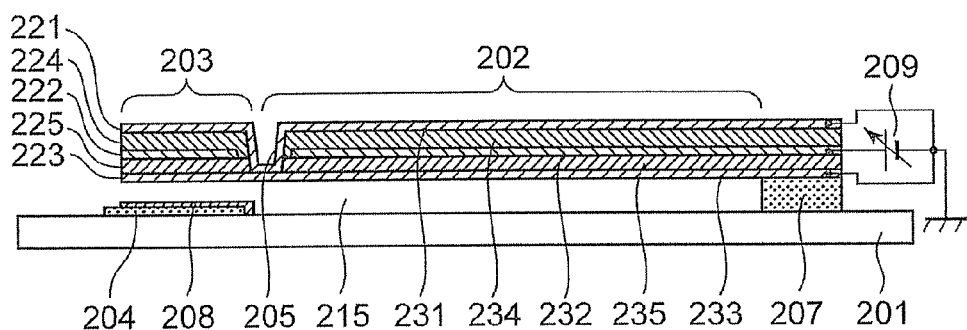
FIG. 14 is a sectional view cut along a line XIV-XIV of FIG. 13.
Figure 15:
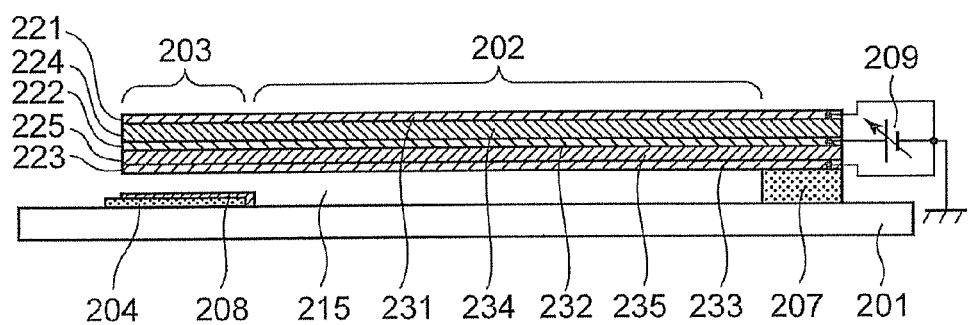
FIG. 15 is a sectional view cut along a line XV-XV of FIG. 13.

FIG. 13 is a conceptual view illustrating a configuration of a second modified example for the piezoelectric-driven MEMS element 14 of the second example, i.e., a piezoelectric-driven MEMS element 15. FIG. 14 is a sectional view cut along the line XIV-XIV of FIG. 13. FIG. 15 is a sectional view cut along the line XV-XV of FIG. 13. As shown in FIG. 13, the piezoelectric-driven MEMS element 15 according to the second modified example differs from the piezoelectric-driven MEMS element 14 of the second example in a connecting position for the lower and upper electrode films to be connected to each other. Specifically, the piezoelectric-driven MEMS element 14 of the second example has the lower and upper electrode films 223, 221 of the movable electrode 203 connected to each other. On the other hand, the piezoelectric-driven MEMS element 15 of the second modified example has the lower and upper electrode films 233, 231 of the piezoelectric actuator 202 connected to each other, and the connecting position thereof is shifted to the side of the fixed portion 207 from the tip of the actuator (an end of the fixed electrode film 204 on the side of the fixed portion) by 0 to 400 μm.

FIG. 16 is a graph illustrating a variation in the Q value of the piezoelectric actuator 202 with respect to the connecting position of the lower and upper electrode films 233, 231 thereof. FIG. 16 shows that the Q value decreases with moving the connecting position thereof closer to the side of the fixed portion 207. When setting a lower limit to the intermediate value of the Q values for the second example and the first comparative example in order to suppress a decrease in the Q value in the second modified example, it is preferable that the connecting position of the lower and upper electrode films 231, 233 of the piezoelectric actuator 202 is from the tip of the piezoelectric actuator 202 to a quarter of the entire length thereof.

Third Example

Figure 18:
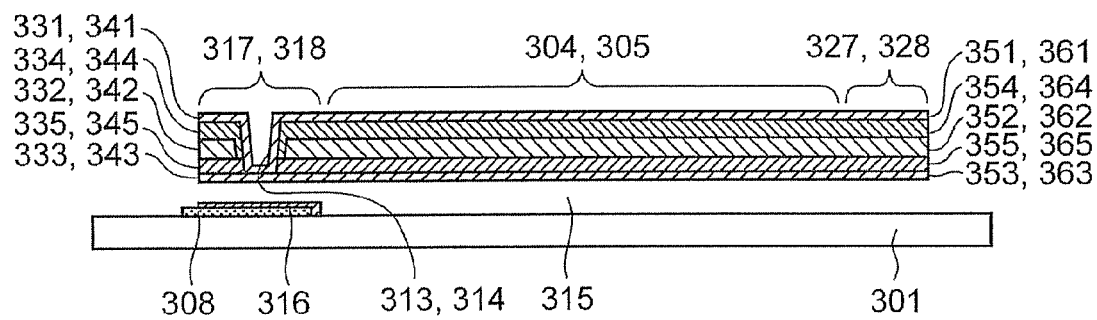
FIG. 18 is a sectional view cut along a line XVIII-XVIII of FIG. 17.
Figure 19:
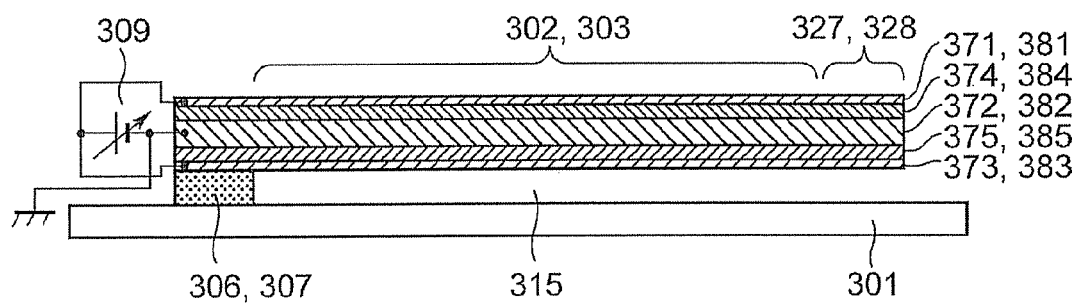
FIG. 19 is a sectional view cut along a line XIX-XIX of FIG. 17.
Figure 20A:
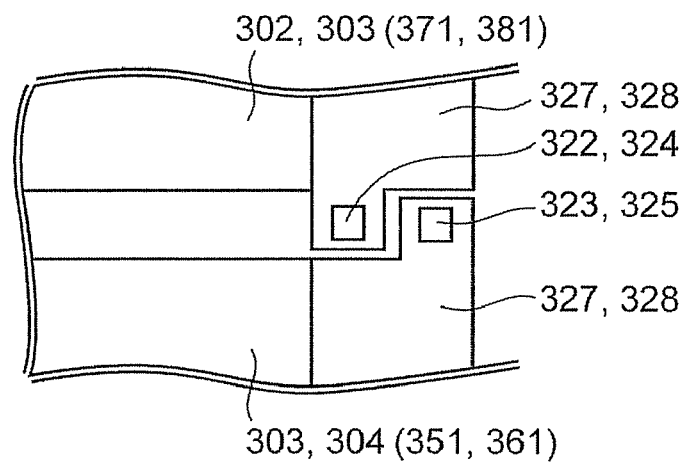
FIGS. 20A to 20C are conceptual views illustrating connections of electrode films of connection portions shown in FIGS. 17 to 19.
Figure 20B:
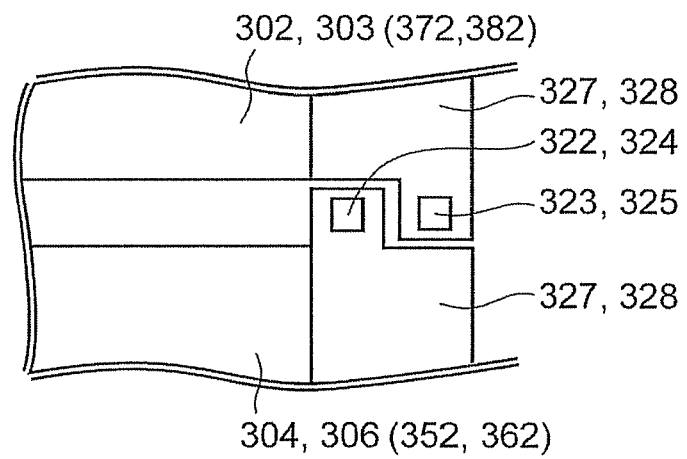
Figure 20C:
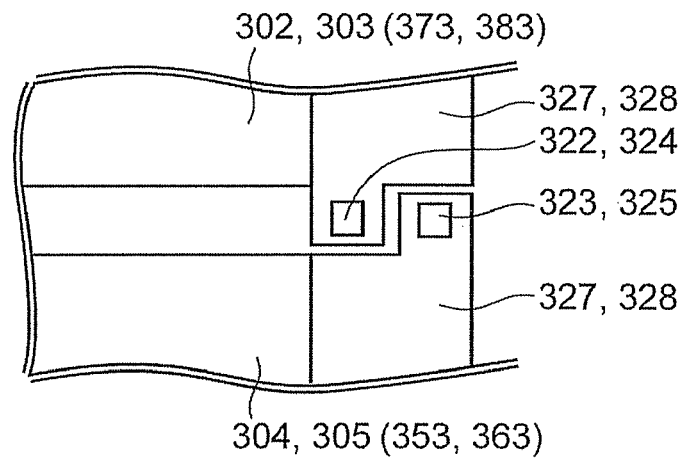

FIG. 17 is a conceptual view illustrating a configuration of a piezoelectric-driven MEMS element 16 according to a third example. FIG. 18 is a sectional view cut along the line XVIII-XVIII of FIG. 17. FIG. 19 is a sectional view cut along the line XIX-XIX of FIG. 17. FIGS. 20A to 20C are conceptual views illustrating the connections of the electrode films of the connection portions 327 and 328 shown in FIGS. 17 to 19.

As shown in FIGS. 17 to 19, the piezoelectric-driven MEMS element 16 according to the third example of the invention is provided with the piezoelectric actuators 302 to 305, the piezoelectric actuator 302 extending from the fixed portion 306 to the connection portion 327, the piezoelectric actuator 303 extending from the fixed portion 307 to the connection portion 328, the piezoelectric actuator 304 extending from the connection portion 327 to the movable electrode portion 317, the piezoelectric actuator 305 extending from the connection portion 328 to the movable electrode portion 318.

And, there exist the following connections:

an end of the piezoelectric actuator 303 is connected to an end of the piezoelectric actuator 305;
an end of the piezoelectric actuator 302 is connected to an end of the piezoelectric actuator 304;
an end of the piezoelectric actuator 304 is connected to the movable electrode portion 317;
an end of the piezoelectric actuator 305 is connected to the movable electrode portion 318 through the connection portion 326; and
the movable electrode portions 317, 318 are connected to each other.

In addition, the fixed portions 306, 307 and the substrate 301 are connected to each other. Furthermore, the piezoelectric actuators 302 to 305, the movable electrode portions 317, 318 are supported with the gap 315 provided above the principal plane of the substrate 301. The fixed electrode portion 308 is formed on the principal plane of the substrate 301 so that the fixed electrode portion 308 faces the movable electrode portions 317, 318.

The piezoelectric actuators 302 to 305, the movable electrode portions 317, 318 are provided with the lower electrode films 333, 343, 353, 363, 373, 383, the lower piezoelectric films 335, 345, 355, 365, 375, 385 formed on the lower electrode films, the middle electrode films 332, 342, 352, 362, 372, 382 formed on the lower piezoelectric films, the upper piezoelectric films 334, 344, 354, 364, 374, 384 formed on the middle electrode films, the upper electrode films 331, 341, 351, 361, 371, 381 formed on the upper piezoelectric films and interconnections 313, 314.

At the connection portion 327 as shown in FIGS. 20A to 20C, the lower and upper electrode films 373, 371 of the piezoelectric actuator 303, and the middle electrode film 372 of the piezoelectric actuator 305 are connected to each other through the interconnection 325. Additionally, the middle electrode film 372 of the piezoelectric actuator 303, and the lower and upper electrode films 353, 351 of the piezoelectric actuator 305 are also connected to each other through the interconnection 324. Also at the connection portion 328 as shown in FIGS. 20A to 20C, the electrode films are connected in similar way to those at the connection portion 327. Accordingly, when a voltage is applied between the lower electrode films 373 and the middle electrode film 352, and between the upper electrode films 371 and the middle electrode film 352 using the battery 309, the actuators 302 to 305 are displaced in a direction perpendicular to the principal plane of the substrate 301. Then, the displacement direction of both the piezoelectric actuators 302 and 303 is opposite to that of both the piezoelectric actuators 304 and 305. This allows it to displace the movable electrode portions 317 and 318 also in a direction perpendicular to the principal plane of the substrate 301.

In addition, the middle electrode films of the piezoelectric actuators 302 to 305 are thicker than the lower and upper electrode films thereof. The movable electrode portions 317, 318 have the same laminated structure as the piezoelectric actuators 302 to 305, while the lower electrode films 333, 343 and the upper electrode films 331, 341 are connected to each other within the movable electrode portions 317, 318.

As mentioned above, the fixed electrode portion 308, and the movable electrode portions 317, 318 face each other to form a capacitor (a capacitive gap) between the fixed electrode portion 308, and the lower electrode films of the movable electrode portions 317, 318. The movable electrode portions 317, 318 are also displaced in accordance with the displacement of the piezoelectric actuators 302, 303. This allows the capacitor to serve as a variable capacitor, the capacitor being formed by the fixed electrode portion 308 and the movable electrode portions 317, 318. A variable capacitor can serve as a switch simultaneously.

Concerning a signal flow of the piezoelectric-driven MEMS element 16, the signal input to the fixed electrode portion 308 passes over a capacitor formed by the lower electrode films 333, 343 of the movable electrode portions 317, 318, and further passes through the following films:

the lower electrode films 333, 343, the interconnections 313, 314 and the upper electrode films 331, 341 of the movable electrode portions 317, 318;

the lower electrode films 353, 363 and the upper electrode films 351, 361 of the piezoelectric actuators 302, 303;

the interconnections 323, 325 of the connecting portions 327, 328; and the middle electrode films 327, 328 of the piezoelectric actuators 304, 305, and is then output.

That is, the input signal passes through electrode films with a low resistance or paralleled interconnections.

Third Modified Example

A piezoelectric-driven MEMS element according to a third modified example is the same as the piezoelectric-driven MEMS element 16 according to the third example, except that the thickness of the middle electrode film is made to be the same as that of the lower and upper electrode films.

Fourth Modified Example

Figure 21:
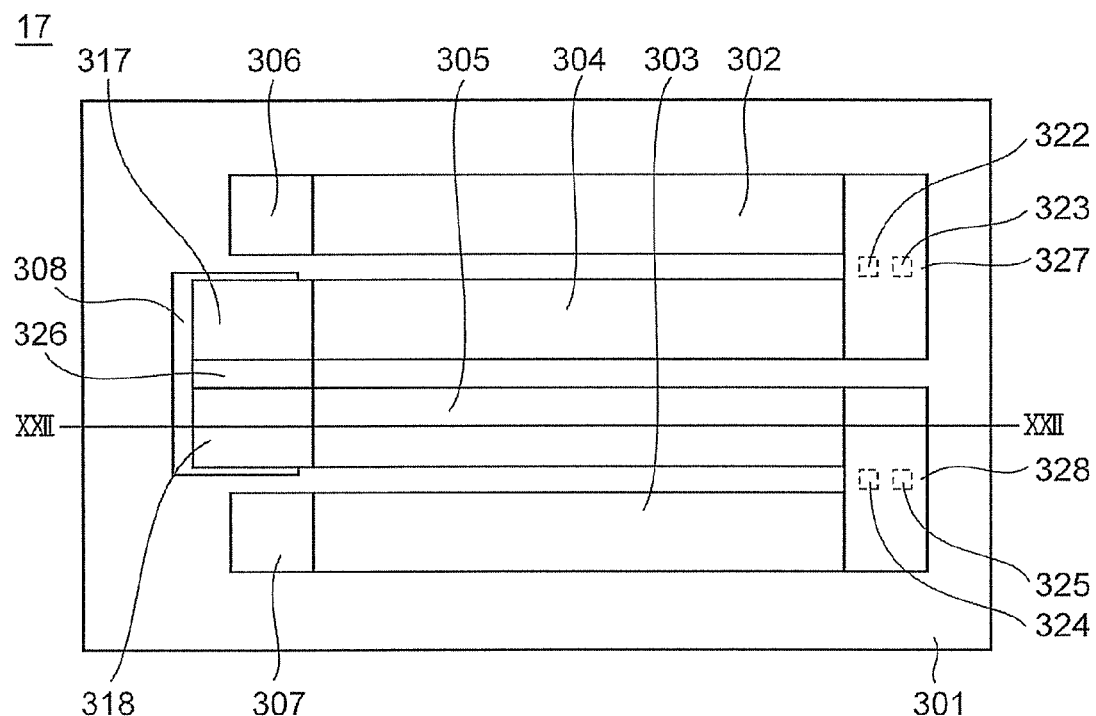
FIG. 21 is a conceptual view illustrating a configuration of a piezoelectric-driven MEMS element similar to the piezoelectric-driven MEMS element of the third example lacking interconnections.
Figure 22:
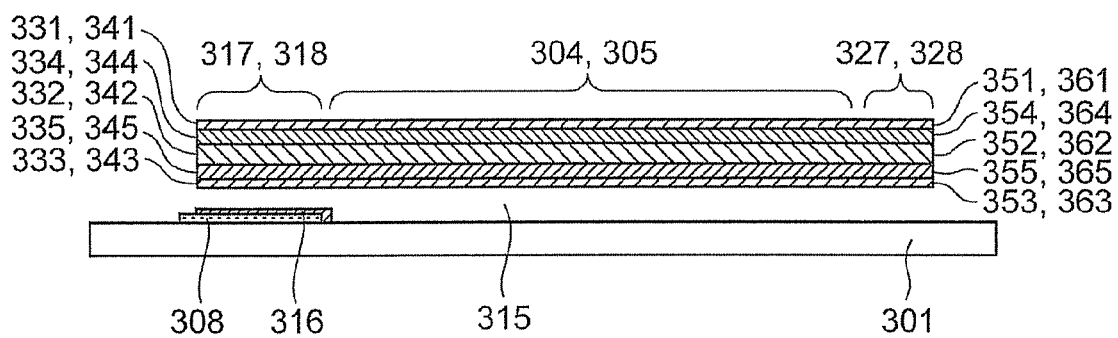
FIG. 22 is a sectional view cut along a line XXII-XXII of FIG. 21.

A piezoelectric-driven MEMS element 17 according to a fourth modified example has a configuration similar to the piezoelectric-driven MEMS element 16 of the third example lacking the interconnections 313, 314, as shown in FIGS. 21 and 22. The piezoelectric-driven MEMS element 17 according to the fourth modified example is the same as the piezoelectric-driven MEMS element 16 of the third example, except that a signal does not pass through the upper electrode films of the backward beam between the fixed electrode portion 308 and the movable electrode portions 317, 318, because the piezoelectric-driven MEMS element 17 lacks interconnections 313, 314.

Second Comparative Example

Figure 23:
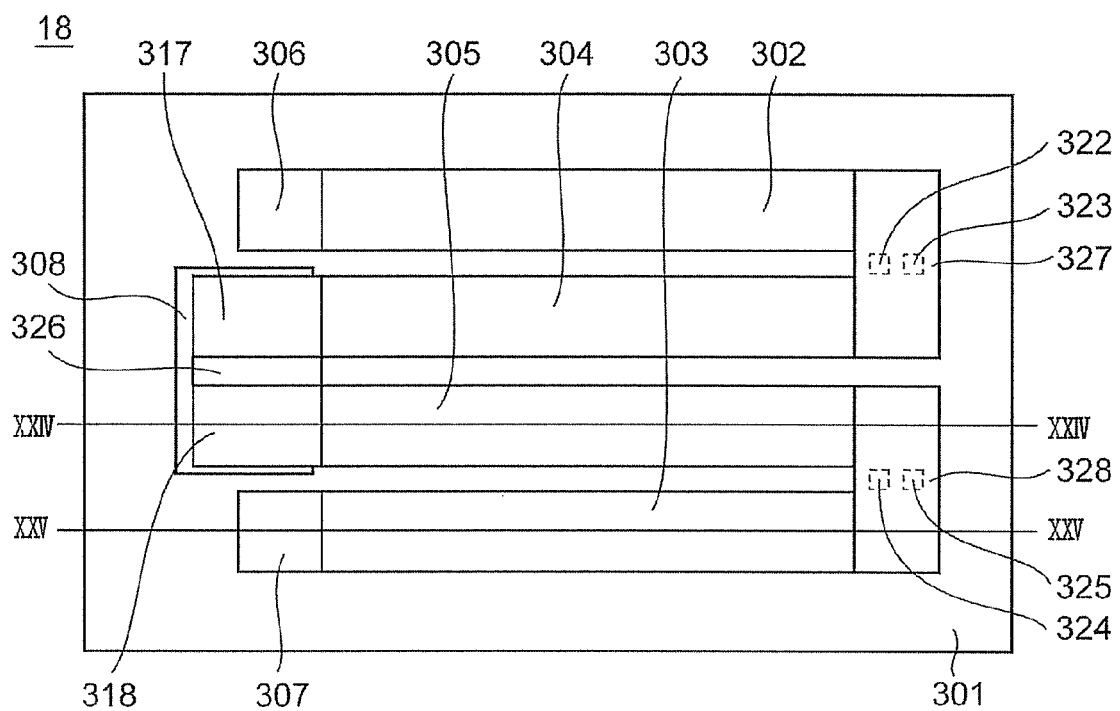
FIG. 23 is a conceptual view illustrating a configuration of a piezoelectric-driven MEMS element where a thickness of a middle electrode film is the same as that of lower and upper electrode films thereof.
Figure 24:
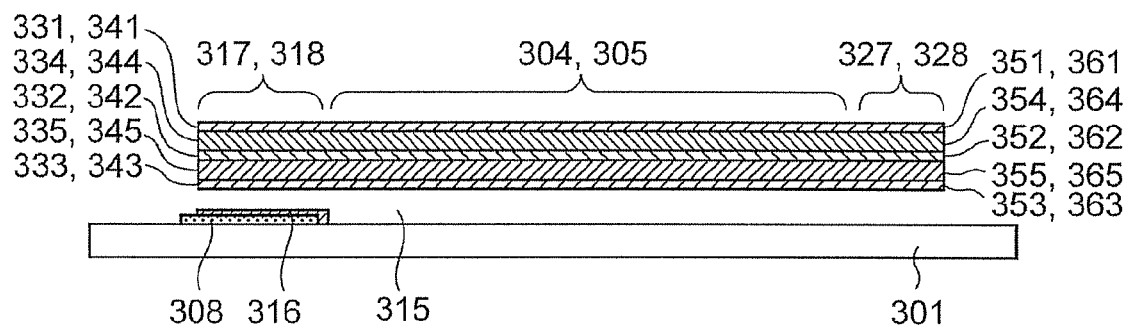
FIG. 24 is a sectional view cut along a line XXIV-XXIV of FIG. 23.
Figure 25:
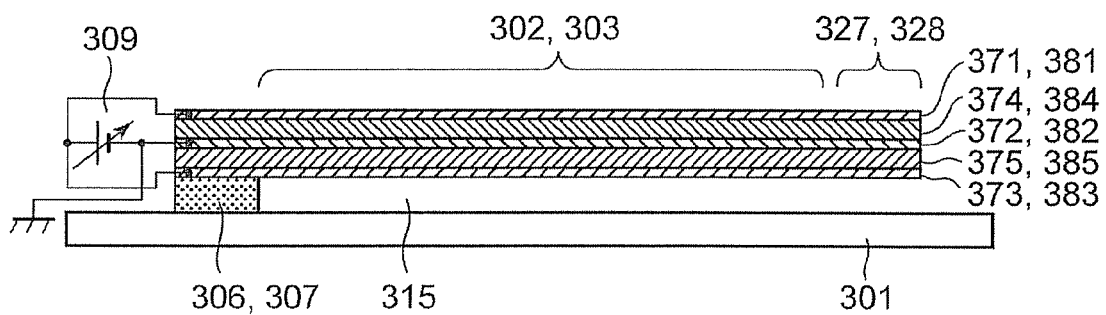
FIG. 25 is a sectional view cut along a line XXV-XXV of FIG. 23.

As shown in FIGS. 23 to 25, a piezoelectric-driven MEMS element 18 according to a second comparative example is the same as the piezoelectric-driven MEMS element 16 according to the fourth modified example, except that the thickness of the middle electrode film is the same as that of the lower and upper electrode films of the piezoelectric-driven MEMS element 18. FIG. 23 is the conceptual view illustrating the configuration of the piezoelectric-driven MEMS element 18 where the thickness of the middle electrode film is the same as that of the lower and upper electrode films thereof. FIG. 24 is a sectional view cut along the line XXIV-XXIV of FIG. 21. FIG. 25 is a sectional view cut along the line XXV-XXV of FIG. 21.

Fourth Example

Figure 27:
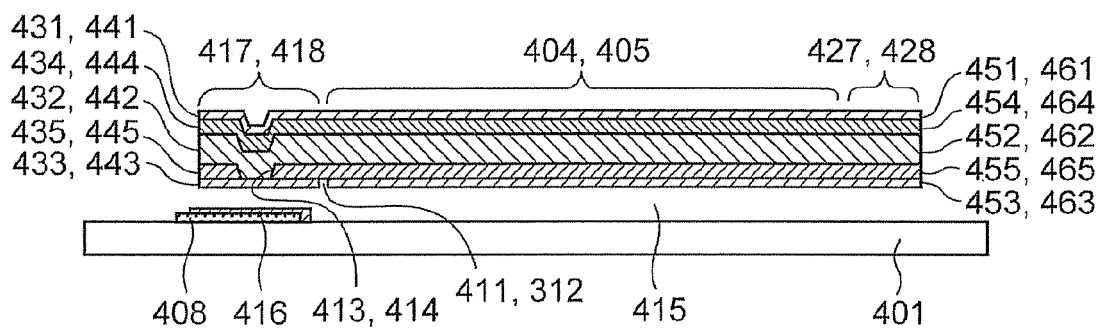
FIG. 27 is a sectional view cut along a line XXVII-XXVII of FIG. 26.
Figure 28:
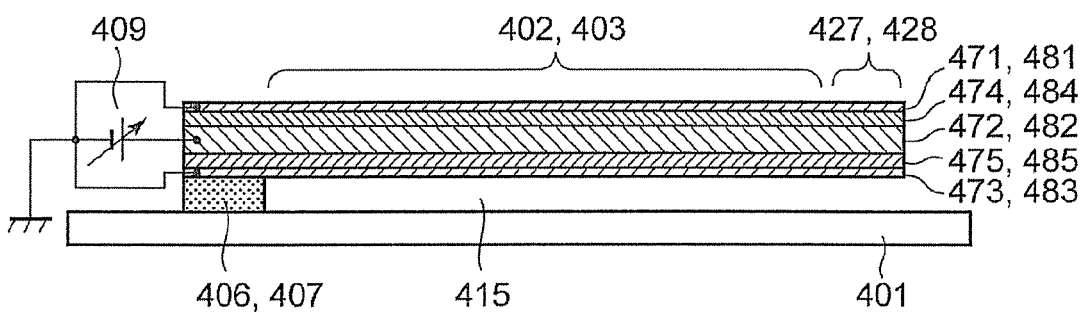
FIG. 28 is a sectional view cut along a line XXVIII-XXVIII of FIG. 26.

FIG. 26 is a conceptual view illustrating a piezoelectric-driven MEMS element 19 provided with a folded structure having a forward beam and a backward beam. FIG. 27 is a sectional view cut along the line XXVII-XXVII of FIG. 26. FIG. 28 is a sectional view cut along the line XXVIII-XXVIII of FIG. 26. As shown in FIGS. 26 to 28, a piezoelectric-driven MEMS element 19 according to a fourth example is the same as the piezoelectric-driven MEMS element 16 according to the third example, except the followings:

the connection portions 413, 414 connect the lower and middle electrode films of the movable electrode portions 417, 418 to each other;

the lower electrode films are separated by the separation portions 411, 412 to the respective sides of the movable electrode portions and the piezoelectric actuators;

the lower and upper electrode films of the forward beam are connected to the middle electrode film of the backward beam by the interconnections; and the middle electrode film of the forward beam, and the lower and upper electrode films of the backward beam are connected to each other by the interconnections 423, 425.

Concerning a signal flow of the piezoelectric-driven MEMS element 19, the signal input to the fixed electrode portion 408 passes over a capacitor (a capacitive gap) formed by the lower electrode films 433, 443 of the movable electrode portions 417, 418, and further passes through the following films:

the lower electrode films 433, 443, the interconnections 413, 414, and the middle electrode films 432, 442 of the movable electrode portions 417, 418;

the middle electrode films 452, 462 of the piezoelectric actuators 402, 403;

the interconnections 422, 424 of the connecting portions 427, 428; and the upper electrode films 471, 481 and the upper electrode films 473, 483 of the piezoelectric actuators 404, 405, and is then output.

Figure 29A:
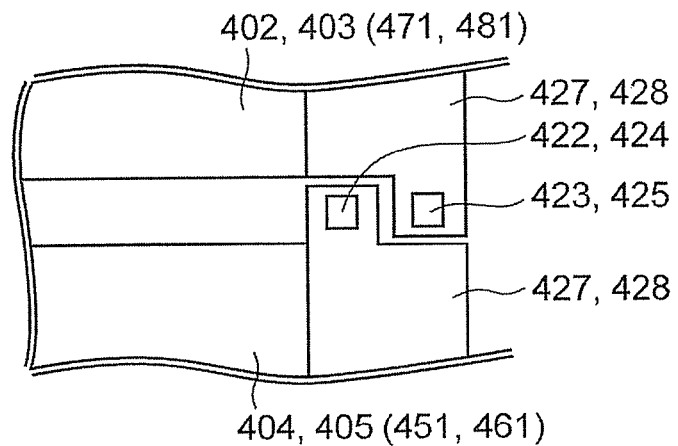
FIGS. 29A to 29C are conceptual views illustrating connections of a electrode films of connection portions.
Figure 29B:
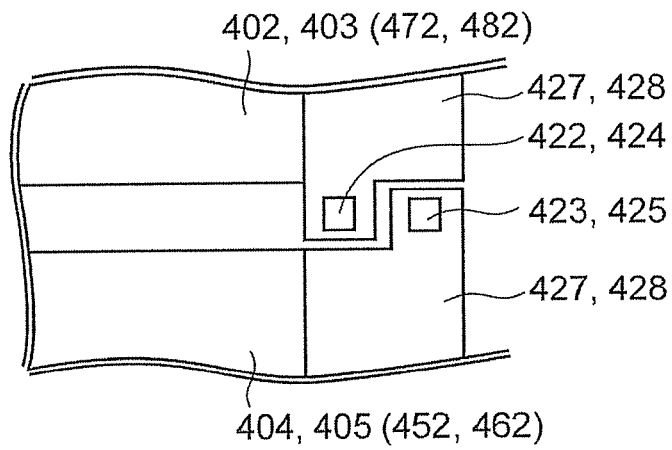
Figure 29C:
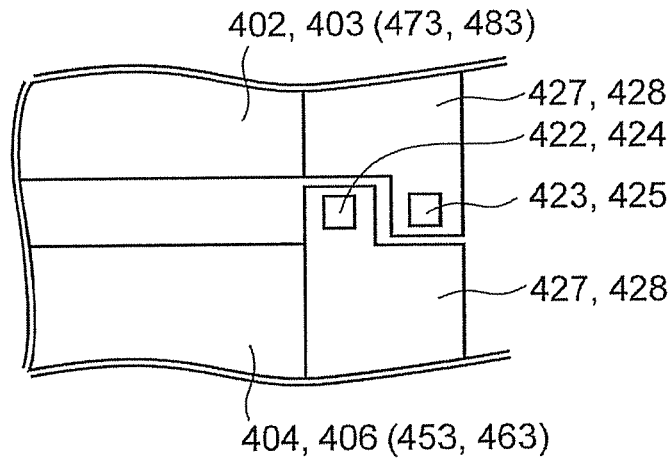

FIGS. 29A to 29C are conceptual views illustrating connections of the electrode films of the connection portions shown in FIGS. 26 to 28. That is, the input signal passes through electrode films with a low resistance or paralleled interconnections.

TABLE 3

| | Q value at 2 GHz |
|---|---|
| piezoelectric-driven MEMS element according to second comparative example | 38 |
| piezoelectric-driven MEMS element according to third example | 65 |
| piezoelectric-driven MEMS element according to third modified example | 45 |

TABLE 3-continued

| | Q value at 2 GHz |
|---|---|
| piezoelectric-driven MEMS element according to fourth modified example | 52 |
| piezoelectric-driven MEMS element according to fourth modified example | 61 |

Table 3 lists the Q values at a capacitance of 0.4 pF for the variable capacitors of the third example, the third modified example, the fourth example, the fourth modified example and the second comparative example for comparison. The piezoelectric-driven MEMS elements of the third example, the third modified example, the fourth example and the fourth modified example have succeeded in suppressing the losses of the output signal in comparison with that of the second comparative example. The piezoelectric-driven MEMS elements of the third and fourth examples with the configurations of the first and second examples combined with each other enable it to suppress the signal losses of the capacitors synergistically. In addition, it is clear that the similar configurations have an effect of suppressing an insertion loss during "ON" on switches therewith as well.

It is possible to produce an electric circuit with a frequency-variable filter of built-in by building the variable capacitors thereinto according to the piezoelectric-driven MEMS elements of the embodiments or examples. For example, the circuits with the above-described MEMS elements built thereinto can be employed for various electronic devices such as a cellular phone.

What is claimed is:

1. A piezoelectric-driven MEMS element, comprising:
   a substrate;
   a forward beam and a backward beam to be arranged in a line symmetry, the forward beam and the backward beam being provided with a lower electrode film, a lower piezoelectric film formed on the lower electrode film, a middle electrode film formed on the lower piezoelectric film, an upper piezoelectric film formed on the middle electrode film and an upper electrode film formed on the upper piezoelectric film, the middle electrode film being thicker than the lower electrode film and the upper electrode film;
   a connection portion connecting the middle electrode film of the forward beam to the upper electrode film and the lower electrode film of the backward beam, and the upper electrode film and the lower electrode film of the forward beam to the middle electrode film of the backward beam;
   a fixed portion to be arranged on the substrate and on a side opposite to the connection portion of the forward beam, the fixed portion fixing an end of the forward beam to hold a portion thereof with a gap above the substrate;
   a fixed electrode portion arranged on the substrate so as to have a capacitive gap between the fixed electrode portion and the other end of the beam; and
   a power source to apply a voltage between the lower electrode film and upper electrode film of the beam, and the middle electrode film of the beam.

2. The element according to claim 1,
   wherein the element includes two MEMS elements according to claim 1;
   wherein two backward beams of the two MEMS elements according to claim 1 are arranged in a line symmetry; and
   wherein two ends of the backward beams on a side of the fixed electrode are connected to each other.

3. The element according to claim 1,
   wherein the lower electrode film and the upper electrode film of the forward beam are connected to the middle electrode film of the backward beam; and
   wherein the lower electrode film and the upper electrode film of the backward beam are connected to the middle electrode film of the backward beam so as to prevent the lower electrode film and the upper electrode film of the backward beam from being in contact with the middle electrode film of the backward beam.

4. The element according to claim 2,
   wherein the lower electrode film and the upper electrode film of the forward beam are connected to the middle electrode film of the backward beam; and
   wherein the lower electrode film and the upper electrode film of the backward beam are connected to the middle electrode film of the backward beam so as to prevent the lower electrode film and the upper electrode film of the backward beam from being in contact with the middle electrode film of the backward beam.

5. The element according to claim 1,
   wherein the middle electrode film of the forward beam is connected to the upper electrode film and the lower electrode film of the backward beam;
   wherein the upper electrode film and the lower electrode film of the forward beam are connected to the middle electrode film of the backward beam;
   wherein the lower electrode film of the backward beam is separated onto a side of the fixed electrode by the separation portion, and is connected to the middle electrode film of the backward beam.

6. The element according to claim 2,
   wherein the middle electrode film of the forward beam is connected to the upper electrode film and the lower electrode film of the backward beam;
   wherein the upper electrode film and the lower electrode film of the forward beam are connected to the middle electrode film of the backward beam;
   wherein the lower electrode film of the backward beam is separated onto a side of the fixed electrode by the separation portion, and is connected to the middle electrode film of the backward beam.

* * * * *